United States Patent
Rutenbar et al.

(10) Patent No.: US 6,918,102 B2
(45) Date of Patent: Jul. 12, 2005

(54) METHOD AND APPARATUS FOR EXACT RELATIVE POSITIONING OF DEVICES IN A SEMICONDUCTOR CIRCUIT LAYOUT

(75) Inventors: Rob A. Rutenbar, Pittsburgh, PA (US); Regis R. Colwell, Pittsburgh, PA (US); Elias L. Fallon, Tempe, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/338,311

(22) Filed: Jan. 8, 2003

(65) Prior Publication Data

US 2003/0131333 A1 Jul. 10, 2003

Related U.S. Application Data

(60) Provisional application No. 60/346,677, filed on Jan. 8, 2002.

(51) Int. Cl.[7] .............................................. G06F 17/50
(52) U.S. Cl. ................ 716/11; 716/1; 716/2; 716/9
(58) Field of Search ................ 716/1, 2, 9, 11, 716/5, 7, 14; 370/334

(56) References Cited

U.S. PATENT DOCUMENTS 6,587,992 B2 * 7/2003 Marple .......................... 716/2

2004/0095907 A1 * 5/2004 Agee et al. ................ 370/334

OTHER PUBLICATIONS

Cook, Peter W., "Constraint Solver for Generalized IC Layout," IBM Journal of Research and Development (Sep. 1984) pp. 581–589, vol. 28, No. 5.

Cormen, Thomas H. et al., "Introduction to Algorithms" (2nd ed. 2001) pp. 588–605, McGraw–Hill Book Company, United States.

* cited by examiner

*Primary Examiner*—Thuan Do
(74) *Attorney, Agent, or Firm*—Morrison & Foerster LLP (57) ABSTRACT

A method of determining the position of devices in a circuit layout includes defining an array of cells and defining a plurality of device outlines in the array, with each device outline received in at least one cell. A set of size constraints is established that expresses the size of each device. For each column and each row of cells having a plurality of device outlines contained completely therein, the position of one of the device outlines is determined and a constraint is established for each other device outline that expresses its position with respect to the position of the one device outline. A spacing constraint for each pair of adjacent device outlines is established that expresses a spacing therebetween. The foregoing constraints are solved simultaneously and a layout of the device outlines is generated in accordance with the solution.

22 Claims, 8 Drawing Sheets

METHOD AND APPARATUS FOR EXACT RELATIVE POSITIONING OF DEVICES IN A SEMICONDUCTOR CIRCUIT LAYOUT

CROSS REFERENCE TO RELATED APPLICATION

This application claims the benefit of U.S. Provisional Patent Application Ser. No. 60/346,677, filed Jan. 8, 2002.

BACKGROUND OF THE INVENTION

1. Field of the Invention

The present invention is a method and apparatus for determining the position of devices in a circuit layout. More specifically, the present invention is a method and apparatus for establishing constraints for devices of a circuit that can be utilized to automatically determine the exact relative position of the devices.

2. Description of Related Art

Figure 1:
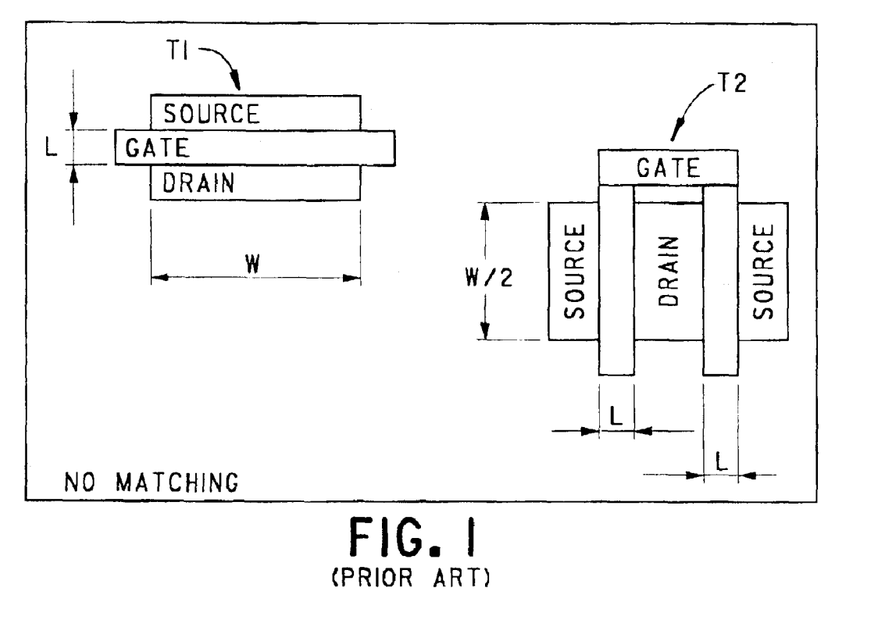
FIG. 1 is an illustration of the layout two devices in accordance with the prior art where the two devices have no matching.

In designing analog circuits to be manufactured using semiconductor processes, a number of techniques are used. Analog semiconductor circuits are often designed to use the ratios between devices (which can be carefully controlled) rather than the absolute values of those devices. Often, for devices in a semiconductor design, the absolute value accuracy can only be kept to 10%–40%. However, the ratio between devices can be controlled to near 0.5% accuracy if correct techniques are used. One of the most commonly used techniques is known as "Matching". Matching can be implemented by a variety of techniques in the physical design of analog semiconductor circuits. All of the techniques for implementing matching involve having two or more devices share some common property. To this end, there are a large number of possible physical implementations for a single device in a circuit which are all roughly electrically equivalent. For example, transistors T1 and T2 shown in FIG. 1 are roughly electrically equivalent because their primary characteristics, (width) W and (length) L, are the same. These two characteristics, W and L (or the Width of the Source and Drain and the Length of the Gate of the transistor) are the primary electrical characteristics that are used to design devices. Two transistors which have the same W and L will exhibit roughly the same electrical behavior.

Figure 2:
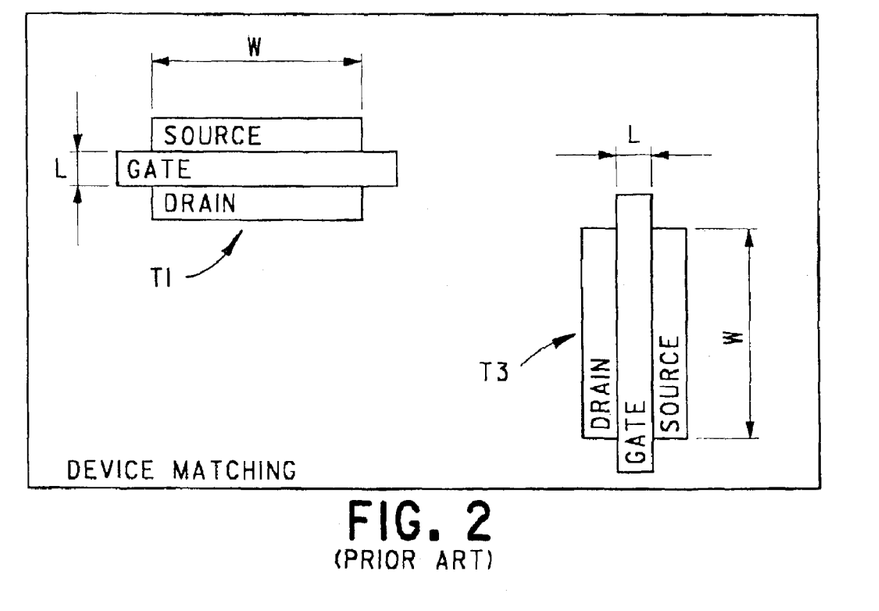
FIG. 2 is an illustration of the layout two devices in accordance with the prior art where the two devices are device matched.

With reference to FIG. 2, and with continuing reference to FIG. 1, in certain circuit designs, however, such as analog circuit designs, the electrical behavior sometimes needs to be much closer than roughly equivalent. For example, in FIG. 1, transistor T1 will have different total areas for Source and Drain than transistor T2. This will affect the capacitance to the substrate for the contacts of transistors T1 and T2. In turn, these differing capacitances will affect the electrical behavior of transistors T1 and T2 so they are not exactly the same. In other words, specifying the same W and L for two devices may make their rough electrical behavior equivalent, but it does not make their detailed electrical behavior the same. This leads to a first type of Matching, referred to as "Device Matching", where a set of devices is all implemented with the exact same geometry. For example, if Device Matching is desired, two devices, e.g., transistors T1 and T3 in FIG. 2, having the same W and L parameters would both be implemented using the same geometry. In contrast, devices, e.g., transistors T1 and T2 in FIG. 1, having different device geometries are not device matched.

Figure 3:
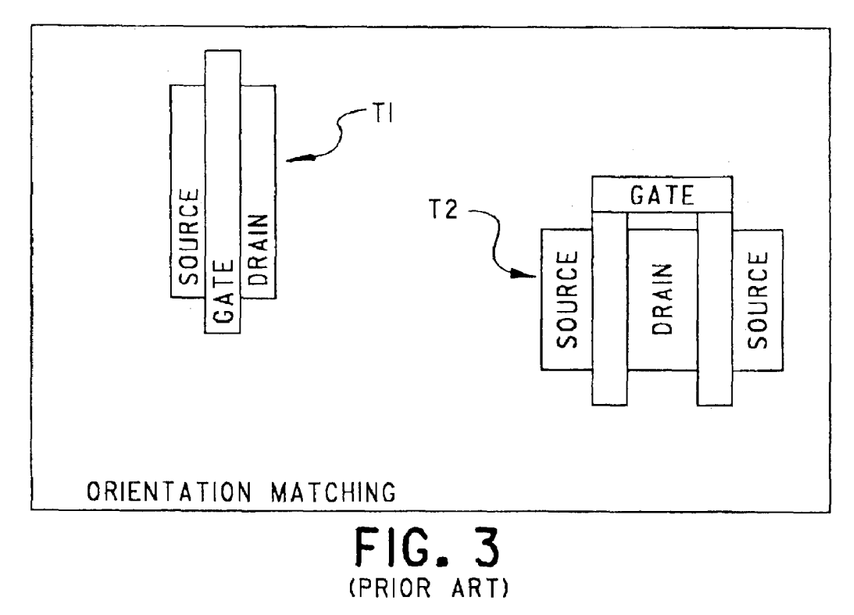
FIG. 3 is an illustration of the layout two devices in accordance with the prior art where the two devices are orientation matched.

With reference to FIG. 3, and with continuing reference to FIG. 1, the detailed electrical behavior of devices on semiconductor surfaces can also change due to manufacturing processes. In order to keep the behavior of these devices as close to electrically equivalent as possible, other types of matching are required. For example, a common semiconductor process variation can cause the top edge of a layer to move relative to the rest of the edges. Thus, for example, if the top edge of all shapes on the polysilicon layer shift downward by a small amount, then there is a different electrical effect on the transistors T1 and T2 shown in FIG. 1. Specifically, transistor T1 will have its L reduced by some small amount. However, in transistor T2, the top edge of the polysilicon layer is simply the connection between two sections of the gate. Therefore, that connection will get slightly narrower, which will increase its resistance but will not affect the W or L of transistor T2. The change in L of transistor T1 and the absence in the change in L of transistor T2 will create an electrical mismatch between the detailed electrical behavior of transistors T1 and T2. This effect can be overcome by ensuring each transistor has the same orientation whereupon these types of process variations affect each device the same way. This is known as "Orientation Matching". In order to make these transistors T1 and T2 match orientation, transistor T1 in FIG. 1 would need to be rotated 90 degrees to the orientation shown in FIG. 3.

Figure 4:
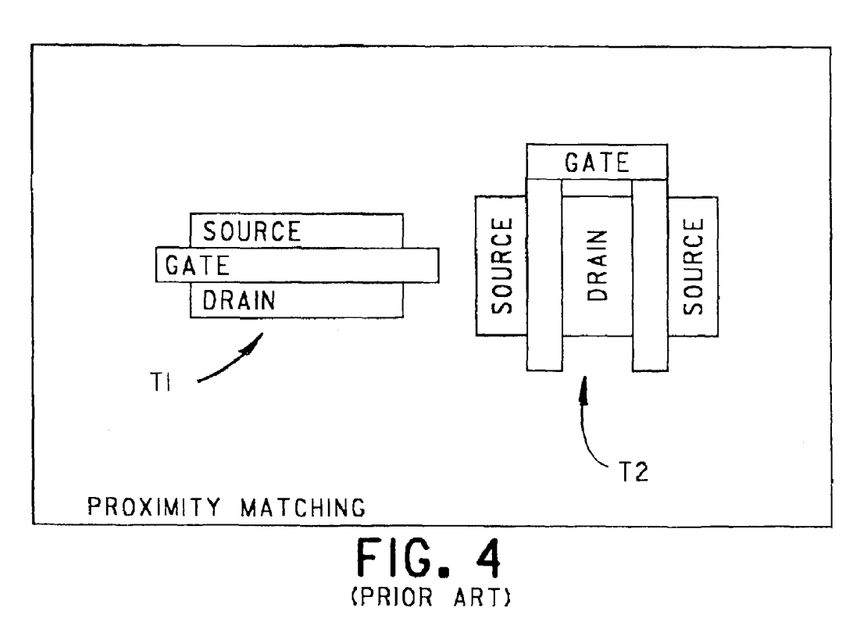
FIG. 4 is an illustration of the layout two devices in accordance with the prior art where the two devices are proximity matched.

With reference to FIG. 4, and with continuing reference to FIG. 1, other types of process variations change over the area of the circuit. Therefore, two devices which are close to each other will show less variation than two devices that are far apart. The amount of doping that occurs in the substrate is a good example of a process-dependent quantity that can vary over distance. This doping amount will affect the ease with which current flows through the device. Obviously, this will impact the equivalence of the two devices' electrical behavior. Therefore, if two devices must be very well matched, they should be placed close to each other. This is known as "Proximity Matching". In order to make transistors T1 and T2 match proximity, they would be placed next to each other as close as possible, as shown in FIG. 4. They would also usually be aligned in either the X or Y direction.

Figure 5:
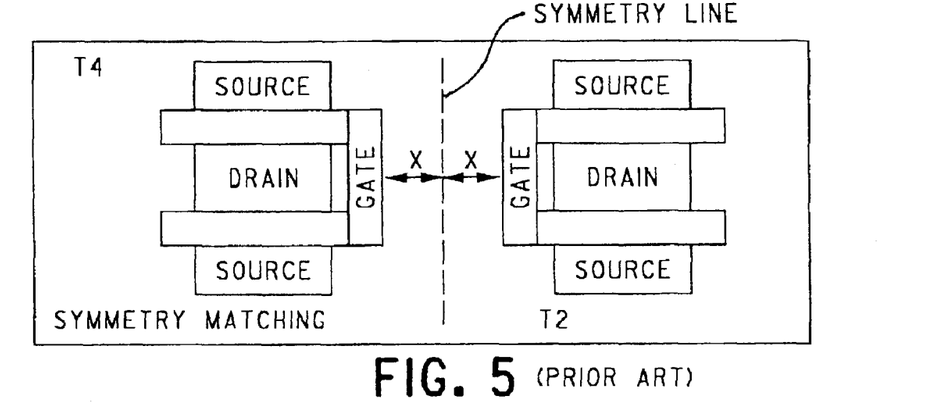
FIG. 5 is an illustration of the layout two devices in accordance with the prior art where the two devices are symmetry matched.

With reference to FIG. 5, and with continuing reference to FIG. 1, one special case of matching, which is used when only two devices need to match, is known as "Symmetry Matching". Two devices, e.g., transistors T2 and T4 in FIG. 5, that should be symmetric are typically device matched. They also typically use a special case of orientation matching where the orientation is mirrored. Additionally, the two devices will usually be aligned in one dimension an equal distance from a specified symmetry line, as shown in FIG. 5.

Figure 6:
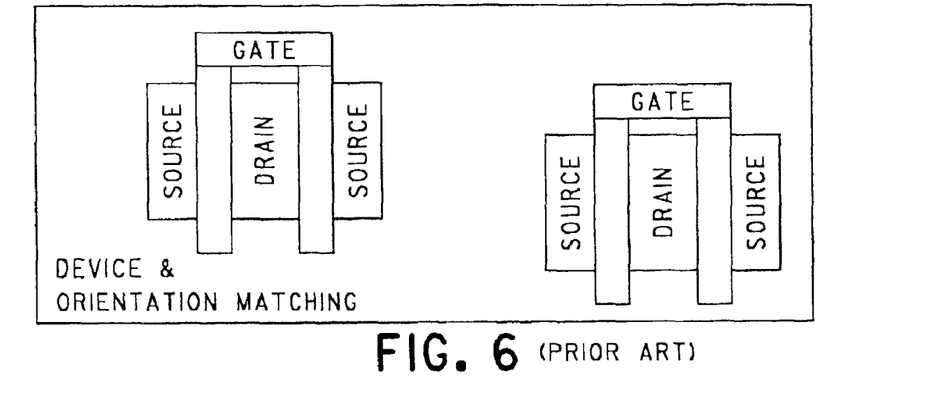
FIG. 6 is an illustration of the layout two devices in accordance with the prior art where the two devices are device and orientation matched.
Figure 7:
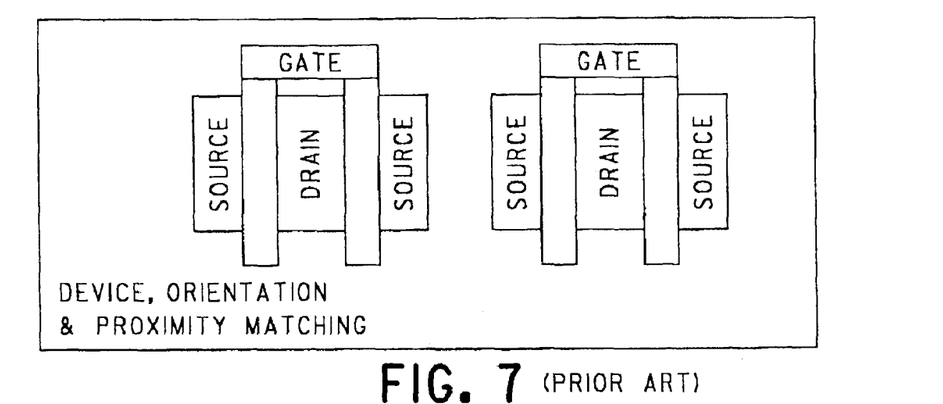
FIG. 7 is an illustration of the layout two devices in accordance with the prior art where the two devices are device, orientation and proximity matched.

FIG. 6 shows a combination of Device and Orientation Matching. FIG. 7 shows a combination of Device, Orientation and Proximity Matching.

The foregoing matching types are utilized in an attempt to achieve higher levels of electrical equivalence between pairs and sets of devices in circuits. Groups of devices using all three matching types or pairs of devices having symmetry have the highest level of electrical equivalence. All of these matching techniques will reduce the percent variation between the ratio of devices in the circuit.

Currently, most circuit designers implement their semiconductor layout manually. Therefore, these matching techniques are performed by hand. However, it is sometimes difficult to verify that the matching techniques have been correctly performed. This is especially true with detailed geometric constraints such as symmetry or proximity matching.

Figure 8A:
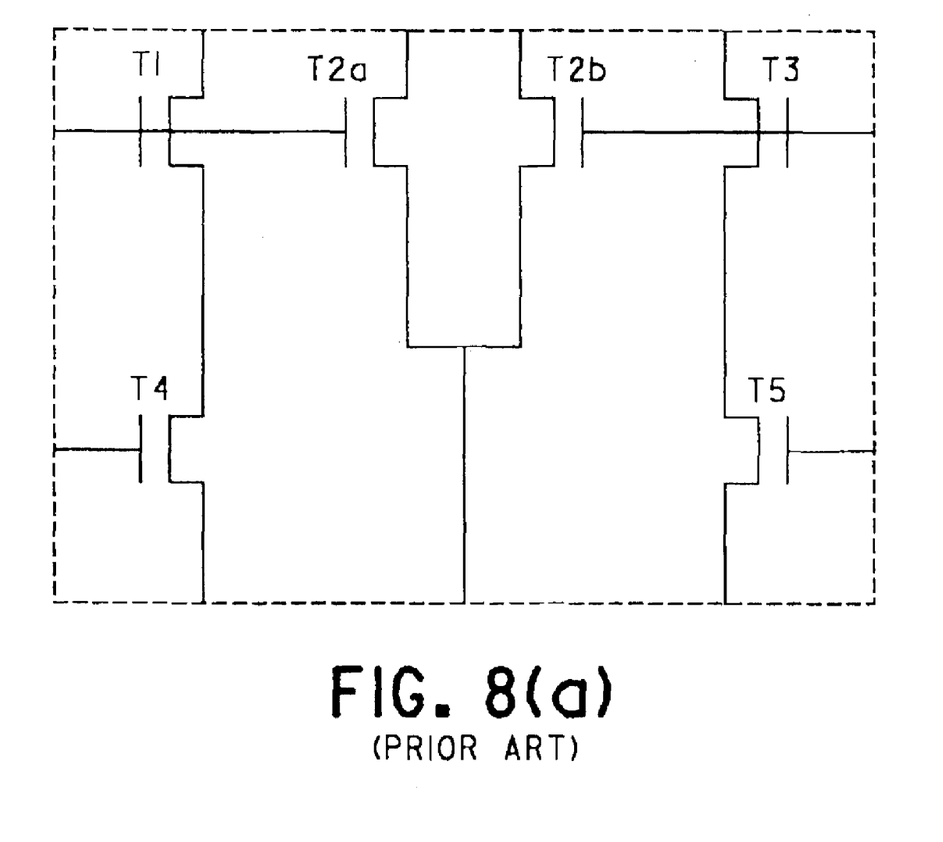
FIG. 8(a) is an illustration of a prior art schematic fragment of a plurality of devices.
Figure 8B:
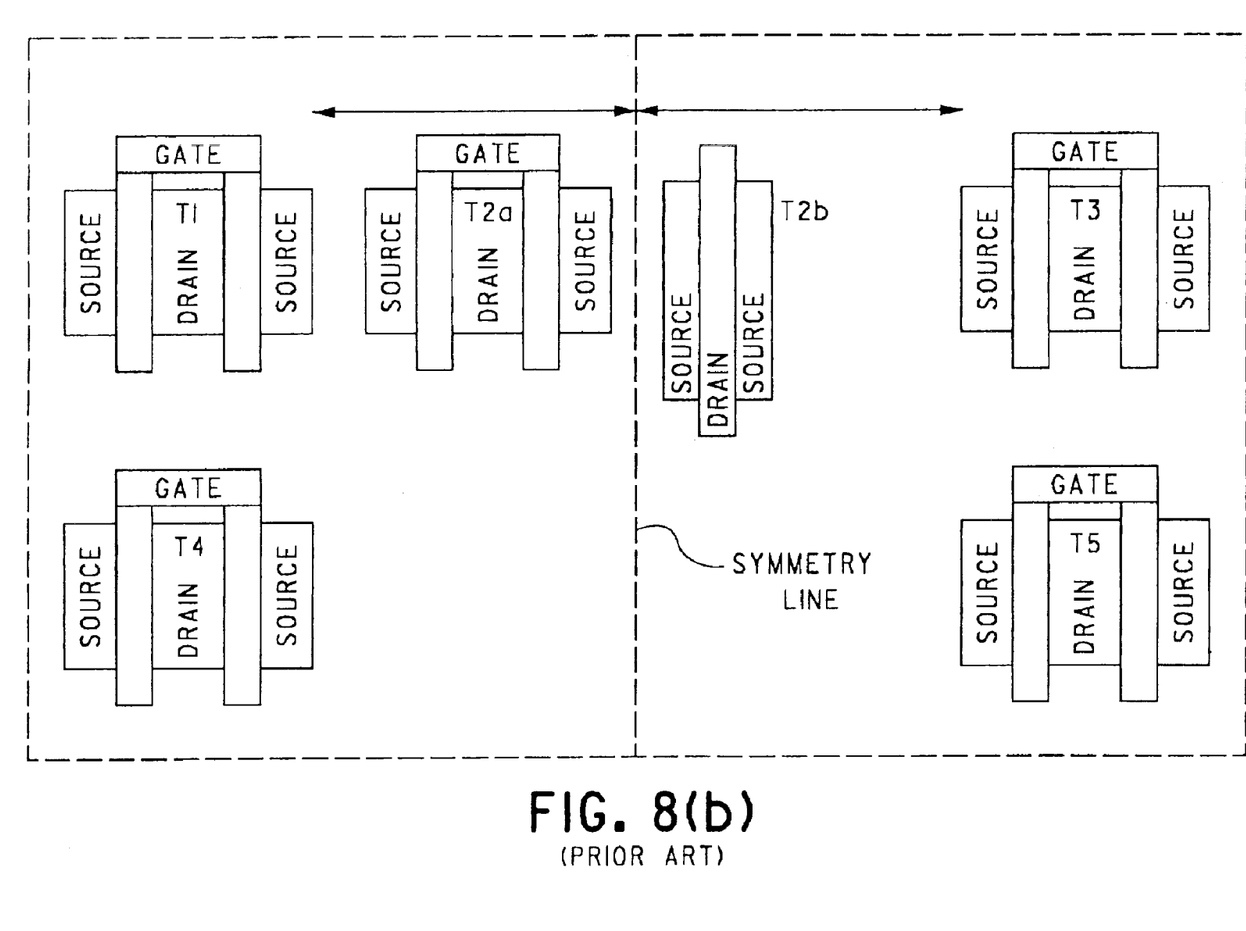
FIG. 8(b) is an illustration of the layout of the plurality of devices shown in FIG. 8(a) in accordance with the prior art.

Another common technique to assure that a physically implemented circuit behaves as expected is to specify the relative position of devices to each other. This technique places devices in the same relative positions as they are on the schematic. This ensures that the interconnections between these devices will be short and that the devices will be placed close to each other. Circuit designers also often place devices as they appear on the schematic purely for simplicity. In addition, designers often align devices to allow for better layout aesthetics and easier routability of interconnections. FIGS. 8(a) and 8(b) show a schematic fragment and a layout, respectively, with devices T1 to T5 in the same relative positions.

It should be noted in FIGS. 8(a) and 8(b) that many of the matching concerns described above also apply. For example, devices T1 and T3 may be specified to be symmetrical. Devices T1 and T4 may be matched in terms of proximity, device and orientation. Similarly, devices T3 and T5 may be matched in terms of proximity, device and orientation. This set of complex matching is possible in current designs implemented by designers since the devices and circuits are designed completely manually. This allows complete freedom to implement any of these concepts of topological placement along with different types of matching.

Some current automatic layout methodologies allow for constraints that specify relative topological placement. These constraints take the form of, for example, Device T1 'isAbove' Device T2, or Device T1 'isLeft' of Device T2, etc. These methodologies also allow for some level of alignment constraints (which give a portion of the matching techniques). However, these layout methodologies are not complete systems that allow for topological layout placement with integrated support for different matching techniques. In addition, the specification of a large set of topological constraints could easily become impossible to satisfy, as well as quite complex and awkward to implement.

Analog circuit design for semiconductor circuits requires a high degree of matching along with the ability to specify relative locations for placement. These two capabilities are necessary to consistently create working layouts from schematic descriptions of circuits. The most prevalent method for creating layouts for analog circuits is a completely manual process. This process has the greatest flexibility to implement all of the techniques described above. However, it is also the most time consuming. As the layout of analog circuits moves toward more automation, these techniques also require automation. The few techniques that are currently implemented in automatic layout systems do not address all the requirements described above.

For example, a schematic representation of a design simply has symbols for each device, but actual geometric information does not yet exist. Therefore, in order to specify the placement of devices relative to each other, specifications must be utilized that are relative to each device. To this end, it cannot simply be stated that device T1 is placed at position x=100, y=100, and that device T2 is placed at position x=100, y=200 since this placement may be Design Rule incorrect according to technology rules for the targeted process, or the devices may even end up overlapping (depending on the height of device T1 in this example). Therefore, it is desirable that placement rules be expressed in a technologically independent way. Typically, this has taken the form of sets of pairwise constraints, e.g., device T2 'isAbove' device T1. This means that device T2 is a specific distance above device T1, aligned on their centers. Typically, this specific distance is determined by the technology rules. For example, the devices might be placed at a minimum design rule correct (DRC) distance. However, once the problem is more complicated than a single pair of devices, it becomes easier to specify a set of impossible constraints. A simple example of a set of impossible constraints is the following set of constraints:

Device T2 isAbove Device T1;
Device T3 isAbove Device T2; and
Device T1 isAbove Device T3.

In this example, it is fairly easy to detect that device T1 cannot be below device T2 AND device T3. However, it is indicative of the larger problem. Once other constraints, such as symmetry, are included, the problem becomes even more difficult. For example:

Device T1 isSymmetric with Device T2;
Device T3 isSymmetric with Device T4;
Device T3 isAbove Device T1; and
Device T2 isAbove Device T4.

Assume only a single vertical symmetry line, and the constraint "isAbove" also implies vertical alignment.

Figure 9:
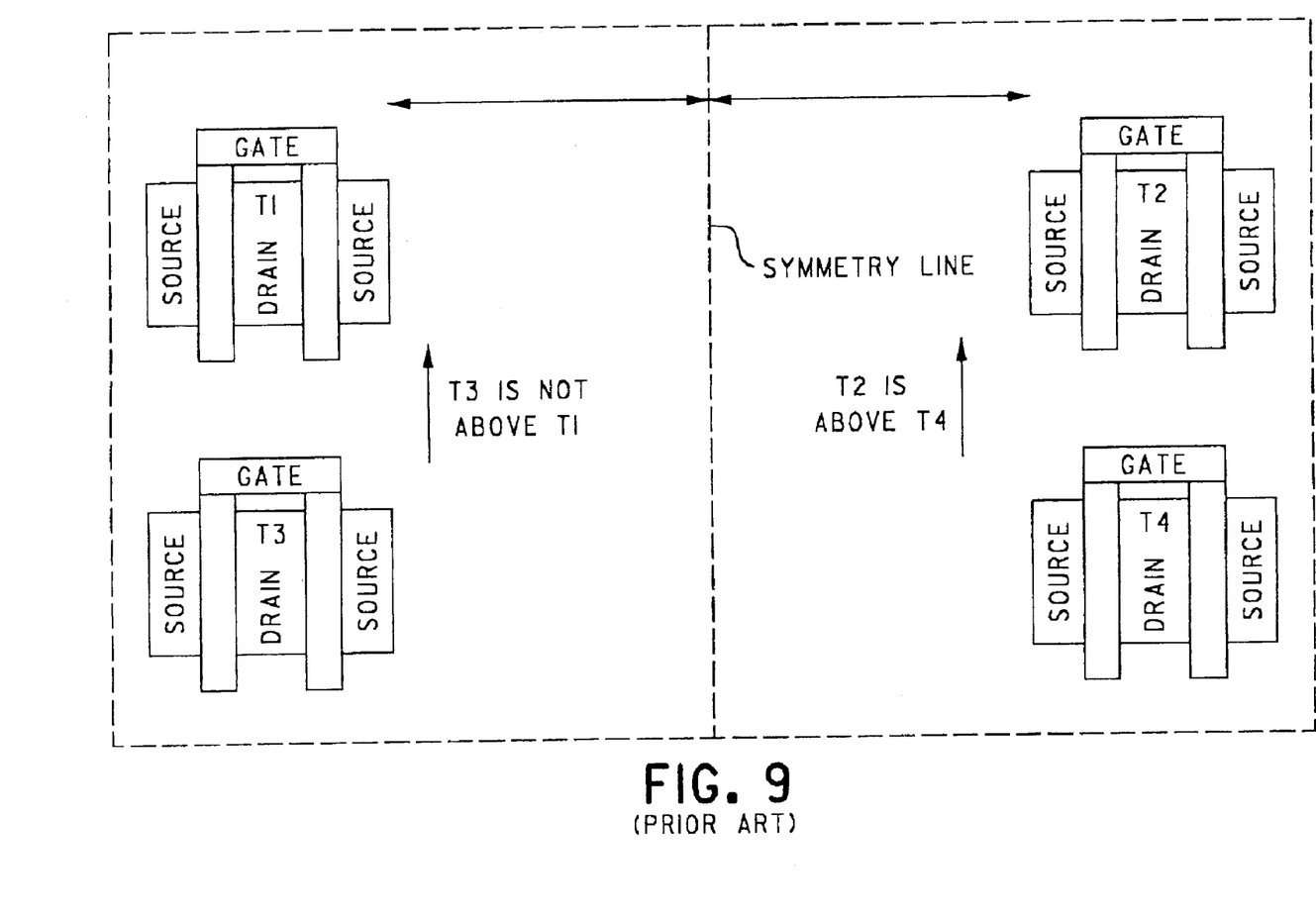
FIG. 9 is an illustration of a layout of devices for a set of impossible constraints in accordance with the prior art.

As shown in FIG. 9, device T3 cannot be symmetric with device T4 AND above device T1 when device T2 is above device T4.

It is, therefore, desirable to overcome these problems and others by providing a method and apparatus for specifying relative topological constraints for devices of a circuit that avoid illegal sets of constraints and enable the relative topological geometry of the devices to be determined automatically. Still other desirable features of the present invention will become apparent to those of ordinary skill in the art upon reading and understanding the following detailed description.

SUMMARY OF THE INVENTION

The invention is a method of determining the position of devices in a circuit layout. The method includes (a) defining a matrix having at least one row or one column of cells; (b) defining a plurality of devices in the matrix, with each device received in at least one cell; (c) establishing for each device a set of size constraints that expresses the size of the device; (d) for a plurality of devices contained completely in a column, determining the position of one of the devices in the column and establishing a constraint for each other device in the column that expresses its position with respect to the position of the one device in the column; (e) for a plurality of devices contained completely in a row, determining the position of one of the devices in the row and establishing a constraint for each other device in the row that expresses its position with respect to the position of the one device in the row; (f) establishing for each pair of adjacent devices a spacing constraint that expresses a spacing therebetween; (g) solving the constraints established in steps (c)–(f) as a set of simultaneous equations to determine a value of a variable of each constraint; and (h) generating a layout of the devices in accordance with the values determined in step (g).

The method also includes, prior to step (g), establishing, for each pair of devices requiring symmetry matching, a set of symmetry constraints with respect to a symmetry line disposed therebetween. The establishing of a set of symmetry constraints can include determining a sum of a number of cells between the pair of devices and a number of cells that include the pair of devices. A side of a cell positioned between opposing sides of the pair of devices can be designated as the symmetry line when the sum of the number of cells is an even number. An imaginary line positioned at a center of a cell between the pair of devices can be designated as the symmetry line when the sum of the number of cells between the pair of devices is an odd number.

The establishing of a set of symmetry constraints can also include determining a first distance between the symmetry line and one of the pair of devices and determining a second distance between the symmetry line and the other of the pair of devices. The greater of the first and second distances can be designated as the symmetry distance. The symmetry constraint for the one device can be the difference between the location of the symmetry line and the symmetry distance. The symmetry constraint for the other device can be the sum of the location of the symmetry line and the symmetry distance.

The set of size constraints for each device can include a constraint that expresses a distance between a left side and a right side of the device, a constraint that expresses a distance between a top edge and a bottom edge of the device, a constraint that expresses a distance between one side of the device and a position intermediate the left and right sides of the device, and a constraint that expresses a distance between one edge of the device and a position intermediate the top and bottom edges of the device.

The method can further include, prior to step (g), establishing a set of position constraints for each device defined in the plurality of cells. The set of position constraints for the device can include, when the device spans a plurality of columns, a constraint that expresses a location of a right side of the device with respect to the location of the right side of the rightmost cell of the plurality of cells and another constraint that expresses a location of a left side of the device with respect to the location of the left side of the leftmost cell of the plurality of cells. When the device spans a plurality of rows, the set of position constraints for the device can include a constraint that expresses a location of a top edge of the device with respect to the location of the top edge of the topmost cell of the plurality of cells and another constraint that expresses a location of a bottom edge of the device with respect to the location of the bottom edge of the bottommost cell of the plurality of cells.

The invention is also a computer readable medium having stored thereon instructions which, when executed by a processor, cause the processor to (a) define a matrix having at least one row or one column of cells; (b) define a plurality of devices in the matrix, with each device received in at least one cell; (c) establish for each device a set of size constraints that expresses the size of the device; (d) if a plurality of devices is contained completely in a column, determine the position of one of the devices in the column and establish a constraint for each other device in the column that expresses its position with respect to the position of the one device; (e) if a plurality of devices is contained completely in a row, determine the position of one of the devices in the row and establish a constraint for each other device in the column that expresses its position with respect to the position of the one device; (f) establish for each pair of adjacent devices a spacing constraint that expresses a spacing therebetween; (g) solve the constraints established in steps (c)–(f) as a set of simultaneous equations to determine a value of a variable of each constraint; and (h) generate a layout of the devices in accordance with the values determined in step (g).

For each pair of devices requiring symmetry matching, the instructions can also cause the processor to determine a set of symmetry constraints with respect to a symmetry line disposed therebetween. The step of determining the set of symmetry constraints includes determining a sum of a number of cells between the pair of devices and a number of cells containing the devices, designating a side of a cell positioned between opposing sides of the pair of devices as the symmetry line when the sum of the number of cells is even, and designating an imaginary line positioned at a center of a cell and between the pair of devices as the symmetry line when the sum of the number of cells is odd.

The step of determining the set of symmetry constraints can also include determining a first distance between the symmetry line and one of the pair of devices; determining a second distance between the symmetry line and the other of the pair of devices; designating the greater of the first and second distances as a symmetry distance; establishing the symmetry constraint for the one device as the difference between the location of the symmetry line and the symmetry distance; and establishing the symmetry constraint for the other device as the sum of location of the symmetry line and the symmetry distance.

The set of size constraints for each device can include a constraint that expresses a distance between a left side and a right side of the device, a constraint that expresses a distance between a top edge and a bottom edge of the device, a constraint that expresses a distance between one side of the device and a position intermediate the left and right sides of the device, and a constraint that expresses a distance between one edge of the device and a position intermediate the top and bottom edges of the device.

The instructions can also cause the processor to establish a set of position constraints for each device defined in the plurality of cells. The set of position constraints can include, when the device spans a plurality of columns, a constraint that expresses a location of a right side of the device with respect to the location of the right side of the rightmost cell of the plurality of cells and another constraint that expresses a location of a left side of the device with respect to the location of the left side of the leftmost cell of the plurality of cells. When the device spans a plurality of rows, the set of position constraints can include a constraint that expresses a location of a top edge of the device with respect to the location of the top edge of the topmost cell of the plurality of cells and another constraint that expresses a location of a bottom edge of the device with respect to the location of the bottom edge of the bottommost cell of the plurality of cells.

Lastly, the invention is a method of determining the position of devices in a circuit layout that includes (a) defining an array of cells, (b) defining a plurality of device outlines in the array, with each device outline received in at least one cell, (c) establishing a set of size constraints that expresses the size of each device, (d) for each column and row of cells having a plurality of device outlines contained completely therein, determining the position of one of the device outlines and establishing a constraint for each other device outline that expresses its position with respect to the position of the one device outline, (e) establishing a spacing constraint for each pair of adjacent device outlines that expresses a spacing therebetween, (f) simultaneously solving the constraints established in steps (c)–(e), and (g) generating a layout of the device outlines in accordance with the solution determined in step (f).

DETAILED DESCRIPTION OF THE INVENTION

The present invention will be described with reference to the accompanying figures where like nomenclature refers to like elements. Moreover, the terms left, right, top, bottom, x or horizontal, y or vertical and the like are used with reference to the accompanying figures and are not to be construed as limiting the invention.

The present invention is embodied in computer readable program code which executes on a processor of a standalone computer or work station that includes a processor, computer storage, an input/output system, a media drive, such as a disk drive, CD ROM drive, etc., and a computer-usable storage medium capable of storing the computer software that embodies the present invention. Under the control of the computer readable program code, the processor is capable of configuring and operating the computer system in a manner to implement the present invention. Computer systems of the type described above are well known in the art and are not described herein for purpose of simplicity.

Figure 10:
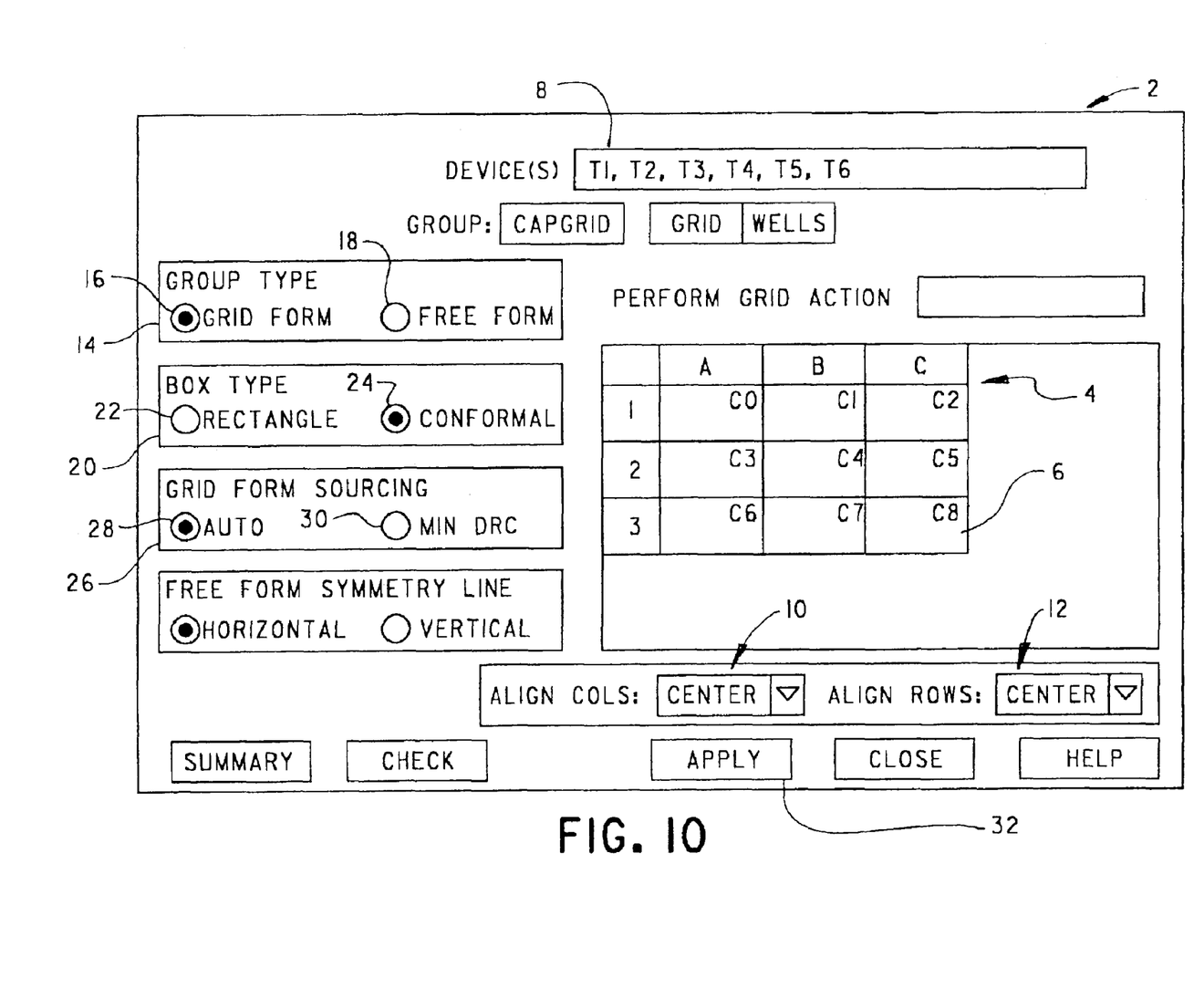
FIG. 10 is a graphical user interface in accordance with the present invention where a user can assign devices to one or more cells of a matrix.

With reference to FIG. 10, a graphical user interface (GUI) 2 includes a matrix 4 of cells 6. In the illustrated embodiment, matrix 4 includes a 3×3 array of cells 6. However, this is not to be construed as limiting the invention since the use of any suitable array of cells 6, such as, for example, a 2×2, 2×3, 1×4 or 4×1 array of cells 6, is envisioned.

GUI 2 includes a "Device(s)" field 8 in which the names of devices, e.g., T1, T2, etc., which represent symbols of transistors, capacitors, resistors, etc. on a schematic (not shown) appear in response to selecting the devices on the schematic.

Once the names of all the desired devices have been included in Device(s) field 8, each device name can be individually selected in a manner known in the art, such as the point and click method. After a device name has been selected, the cell or cells in matrix 4 where the device is to be assigned is selected. Responsive to this selection, the device name will appear in the cell or cells to which it is assigned. Suitable criteria can be established for handling the assignment of devices larger than an individual cell 6 to two or more cells 6.

An align columns (Align Cols) pull down menu 10 and an align rows (Align Rows) pull down menu 12 can be utilized to select the type of alignment to use for the columns and rows, respectively, of matrix 4. The alignment types available for selection in align columns pull down menu 10 include "Left", "Center" and "Right" while the alignment types available for selection in align rows pull down menu 12 include "Top", "Center" and "Bottom".

Selection of the Left alignment type in align columns pull down menu 10 causes the left edge of each device to align with the leftmost edge of the cell or cells containing the device. Similarly, selection of the Right alignment type in align columns pull down menu 10 causes the right edge of each device to align with the rightmost edge of the cell or cells containing the device. However, selection of the Center alignment type in align columns pull down menu 10 causes the vertical center of each device to align with the vertical center of the cell or cells containing the device.

Selection of the Top alignment type in align rows pull down menu 12 causes the top edge of each device to align with the topmost edge of the cell or cells containing the device. Similarly, selection of the bottom alignment type in align rows pull down menu 12 causes the bottom edge of each device to align with the bottommost edge of the cell or cells containing the device. However, selection of the center alignment type in align rows pull down menu 12 causes the horizontal center of each device to align with the horizontal center of the cell or cells containing the device.

GUI 2 includes a "Group Type" field 14 including a Grid Form radio button 16 and a Free Form radio button 18. Selection of Grid Form radio button 16 displays matrix 4 wherein devices included in Device(s) field 8 can be assigned to one or more cells 6. Selection of Free Form radio button 18 enables Free Form placement of the devices included in Device(s) field 8 in a field (not shown) displayed in place of matrix 4.

GUI 2 also includes a "Box Type" field that includes a Rectangle radio button 22 and a Conformal radio button 24. Selection of Rectangle radio button 22 causes a single bounding rectangle to be utilized as the boundary for the devices assigned to the cells 6 of matrix 4. Selection of Conformal radio button 24 causes the devices assigned to cells 6 of matrix 4 to be received in a boundary that more closely follows the edges of the devices.

A "Grid Form Spacing" field 26 of GUI 2 includes an Auto radio button 28 and a MinDRC radio button 30. Selection of Auto radio button 28 causes the devices included in matrix 4 to be placed in a manner that leaves room for routing of interconnections and the like. Selection of MinDRC radio button 30 causes the devices contained in matrix 4 to be placed at a minimum design rule correct (DRC) spacing.

After selecting appropriate radio buttons in, among other things, fields 14, 20 and 26, Apply button 32 is selected whereupon the matrix constraints, including the alignment and symmetry constraints of devices assigned to cells of matrix 4, the boundary of matrix 4, the location of the sides and edges of each cell, etc. are stored in memory.

Once the matrix constraints are stored, they can be transformed into a constraint graph data structure which can be solved to determine the exact relative position of each device T in matrix 4. Thereafter, the constraint graph data structure can be solved again, with symmetry constraints included in the constraint graph data structure, to solve for symmetry constraints. The final solution for the constraint graph data structure yields the final exact relative position for each device T in matrix 4. The foregoing steps will now be described in greater detail with reference to FIG. 11 which shows devices T1, T2, T3, T4, T5 and T6 assigned cells C0, C1, C2, C3–C4, C5 and C6–C8, respectively.

Figure 11:
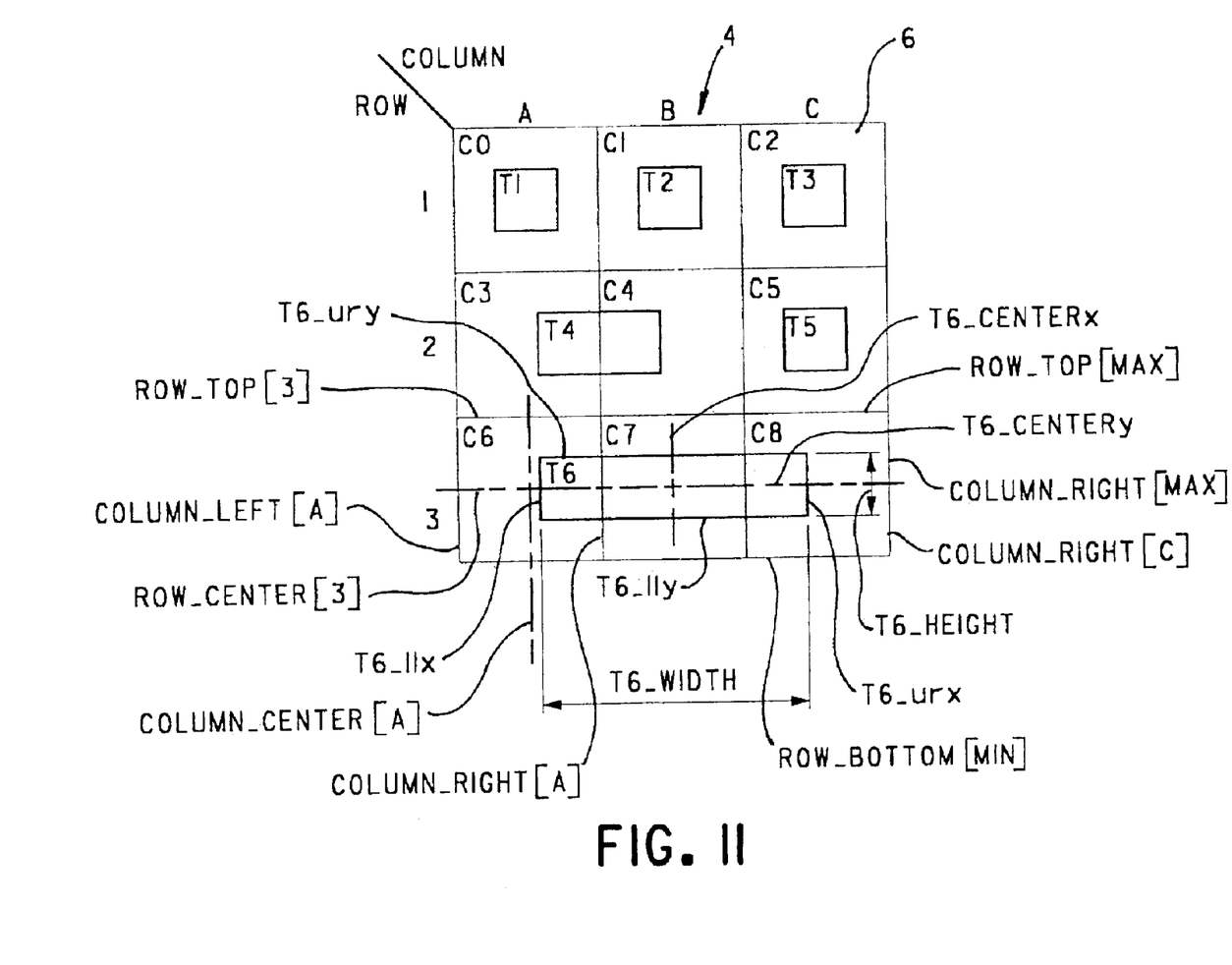
FIG. 11 is an enlarged view of the matrix shown in FIG. 10 including devices assigned to the cells thereof.

The Constraint graph data structure includes for each device T1 to T6, eight variables, namely, [ObjName]_llx, [ObjName]_lly, [ObjName]_urx, [ObjName]_ury, [ObjName]_centerx, [ObjName]_centery, [ObjName]_width, and [ObjName]_height where:

[ObjName] is the name of the device, e.g., T1, T2, etc.;
llx=lower left x or leftmost side of the device;
lly=lower left y or bottommost edge of the device;
urx=upper right x or rightmost side of the device;
ury=upper right y or topmost edge of the device;
centerx=x coordinate center of the device;
centery=y coordinate center of the device;
width=horizontal width of the device; and
height=vertical height of the device.

Constraint graph data structure 40 also includes two variables for each column, namely, Column_right[x] and Column_center[x], where:

Column_right[x]=the x coordinate at the rightmost edge of the column; and
Column_center[x]=the x coordinate center of the column;

and two variables for each row, namely, Row_top[y] and Row_center[y], where:

Row_top[y]=y coordinate at the topmost edge of the column; and
Row_center[y]=y coordinate center of the column.

Illustrative examples of the foregoing variables are shown in FIG. 11 in connection with device T6, columns A–C and row 3.

Once the foregoing variables have been established, the basic constraints for the constraint graph data structure can be established. These constraints include the following size constraints for each device:

[ObjName]_urx=[ObjName]_llx+[ObjName]_width;
[ObjName]_ury=[ObjName]_lly+[ObjName]_height;
[ObjName]_centerx=[ObjName]_llx+[ObjName]_width/2; and
[ObjName]_centery=[ObjName]_lly+[ObjName]_height/2.

For each device that spans multiple cells, e.g., devices T4 and T6 in FIG. 11, position constraints are defined therefor. The various position constraints are defined as follows:

For each device in a Column, where this column is the device's rightmost column, if the device spans multiple columns, add the following constraint:

[ObjName]_urx≦Column_right[max],
where [ObjName]=the name of the device, e.g., T1, T2, etc.;
right [max]=rightmost column of [ObjName]; and
column_right [max]=right side of right [max].

For each device in a Column, where this column is the device's leftmost column, if the device spans multiple columns, add the following constraint:

[ObjName]_llx≧Column_left[min],
where [ObjName]=the name of the device, e.g., T1, T2, etc.;
left[min]=leftmost column of [ObjName]; and
Column_left[min]=left side of left[min].

For each device in a Row, where this row is the device's top row, if the device spans multiple rows, add the following constraint:

[ObjName]_ury≦Row_top[max],
where [ObjName]=the name of the device, e.g., T1, T2, etc.;
top[max]=topmost row of [ObjName]; and
Row_top[max]=top edge of top[max].

Lastly, for each device in a Row, where this row is the device's bottom row, if the device spans multiple rows, add the following constraint:

[ObjName]_lly≧Row_bottom[min],
where [ObjName]=the name of the device, e.g., T1, T2, etc.;
bottom[min]=bottommost row of [ObjName]; and
Row_bottom[min]=bottom edge of bottom[min].

The foregoing constraints represent the basic constraints of the constraint graph data structure. These constraints set the basic size of each device T and limit each device T to its Row and Column.

The constraint graph data structure also includes alignment rules for devices T1 to T6 in cells 6 of matrix 4. To this end, for each column, one of the devices T contained completely in the column is selected and the descriptor "objA" is appended to the name of the device, e.g., [ObjName_objA]. Next, for each remaining device contained completely in the column, one of the following constraints is included in the constraint graph data structure to define the alignment of the devices contained completely in the column.

If [ObjName_objA] is center aligned:
[ObjName]_centerx=[ObjName_objA]_centerx;
If [ObjName_objA] is left aligned:
[ObjName]_llx=[ObjName_objA]_llx; and
If [ObjName_objA] is right aligned:
[ObjName]_urx=[ObjName_objA]_urx.

Similarly, for each row, one of the devices that is contained completely in the row is selected and the descriptor "objB" is appended to the name of the device, e.g., [ObjName_objB]. For each remaining device contained completely in the row, one of the following constraints is included in the constraint graph data structure to define the alignment of devices contained completely in the row.

If [ObjName_objB] is center aligned:
[ObjName]_centery=[ObjName_objB]_centery;
If [ObjName_objB] is bottom aligned:
[ObjName]_lly=[ObjName_objB]_lly; and
If [ObjName_objB] is top aligned:
[ObjName]_ury=[ObjName_objB]_ury.

Next, the constraints for design rule correct (DRC) spacing are determined and included in the constraint graph data structure. To determine the constraints for DRC spacing, the relative position any two devices T in matrix 4 is determined. To this end, the position of each device [objA] in matrix 4 is determined with respect to each adjacent device [objB] in the horizontal and vertical directions and one of the following constraints is included in the constraint graph data structure for each pair of horizontally and vertically adjacent devices:

If ObjB is above ObjA,
[ObjName_objA]_ury≦[ObjName_objB]_lly−distanceA,
where distanceA=DRC spacing between objA and objB;
If objB is below objA,
[ObjName_objA]_lly≧[ObjName_objB]_ury+distanceB,
where distanceB=DRC spacing between objA and objB;

If objB is right of objA,
   [ObjName_objA]_urx≦[ObjName_objB]_llx−distanceC,
where distanceC=DRC spacing between objA and objB; and
If objB is left of objA,
   [ObjName_objA]_llx≧[ObjName_objB]_urx+distanceD,
where distanceD=DRC spacing between objA and objB.

Once the foregoing constraints have been included, as needed, in the constraint graph data structure, a legal exact solution to the constraint graph data structure can be determined by solving the constraints of the constraint graph data structure as a system of simultaneous equations to determine the values of the variables of the constraints.

Any suitable method for solving the constraint graph data structure can be utilized. For example, one method is the Bellman-Ford Algorithm described in Cormen et al., "Introduction to Algorithms, $2^{nd}$ edition, pages 588–605, 2001, published by McGraw-Hill Book Company, Cambridge, Mass. Another method is a modification of the Bellman-Ford Algorithm disclosed in Peter W. Cook, "Constraint Solver for Generalized IC Layout", IBM Journal of Research and Development, Vol. 28, No. 5, September 1984 which is optimized for handling many equality constraints in the constraint graph data structure. The latter method is useful for solving the constraint graph data structure described above since a large number of the constraints are equalities.

At this point, a solution has been determined for the exact relative position for each device T in the matrix 4 in the absence of any symmetry constraints. This solution is design rule correct and usable in its current form in any other data structure or process that is utilized in the design of circuit(s) that utilize the layout of devices T shown in matrix 4. If the solution has no symmetry relationships, the solution is complete. If, however, the solution has one or more symmetry relationships, then each symmetry relationship needs to be evaluated.

To this end, the symmetry relationships are desirably arranged in a sorted list by the number of cells that are spanned by the two devices that are symmetric. The sort order between symmetry relationships that span the same number of cells does not matter. However, the sort desirably has the symmetry relationships in order from smallest number of cells spanned to largest. If the current design has only one symmetry relationship, the sorted list will have only one entry.

Next, for each symmetry relationship in order from the smallest number of cells spanned to the largest number of cells spanned, the "variable" between the two symmetric devices is determined. For example, if a first device [ObjName_obj1] is to the left of a second device [ObjName_obj2] in a row and if the sum of the number of columns that include the first and second devices and the number of columns between the first and second devices is an even number, the variable between the two devices is the right side of a column. However, if the sum of the number of columns is an odd number, then the variable between them is the center of a column. The variable which is closest to being between the two devices is now defined as the symmetry line variable (symLineVar) for this symmetry constraint.

Next, the distance from symLineVar to the rightmost edge of [ObjName_obj1] and the distance from symLineVar to the leftmost edge of [ObjName_obj2] are determined. The greater of those two distances is then chosen and assigned to a variable "symDist". The following pair of symmetry constraints is then included in the constraint graph data structure:

[ObjName_obj1]_urx=symLineVar−symDist; and
[ObjName_obj2]_llx=symLineVar+symDist;
where [ObjName_obj1]_urx=the upper right x position of device [ObjName_obj1]; and
[ObjName_obj2]_llx=the lower left x position of device [ObjName_obj2].

If the two devices share the same column instead of row (and, therefore, are positioned in vertical symmetry instead of horizontal), then the same procedure is utilized except Y values ury and lly are used instead of X values urx and llx.

Once the pair of symmetry constraints is added to the constraint graph data structure to account for the corresponding symmetry relationship, the constraint graph data structure is solved again so all values will be updated.

Once this is complete, if other symmetry relationships remain in the sorted list, pairs of symmetry constraints are determined for each symmetry relationship in the list, one at a time, and the constraint graph data structure is solved for each pair of symmetry constraints, one at a time.

Once all the symmetry constraints described above have been processed a solution has been determined for the exact relative position of each device T in matrix 4 that takes into account each symmetry relationship, whereupon the exact final position of each device in matrix 4 can be extracted from the constraint graph data structure for use in other data structures or processes utilized in the design of circuits that utilize the layout of devices T shown in matrix 4.

The present invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of determining the position of devices in a circuit layout comprising:
   (a) defining a matrix having at least one row or one column of cells;
   (b) defining a plurality of devices in the matrix, with each device received in at least one cell;
   (c) establishing for each device a set of size constraints that expresses the size of the device;
   (d) for a plurality of devices contained completely in a column, determining the position of one of the devices in the column and establishing a constraint for each other device in the column that expresses its position with respect to the position of the one device in the column;
   (e) for a plurality of devices contained completely in a row, determining the position of one of the devices in the row and establishing a constraint for each other device in the row that expresses its position with respect to the position of the one device in the row;
   (f) establishing for each pair of adjacent devices a spacing constraint that expresses a spacing therebetween;
   (g) establishing, for each pair of devices requiring symmetry matching, a set of symmetry constraints with respect to a symmetry line disposed therebetween;
   (h) solving the constraints established in steps (c)–(g) as a set of simultaneous equations to determine a value of a variable of each constraint; and
   (i) generating a layout of the devices in accordance with the values determined in step (h).

2. The method of claim 1, wherein the step of establishing a set of symmetry constraints for each pair of devices requiring symmetry matching includes:

determining a number of cells that include and are between the pair of devices;

designating a side of a cell positioned between opposing sides of the pair of devices as the symmetry line when the number of cells is even; and designating an imaginary line positioned at a center of a cell between the pair of devices as the symmetry line when the number of cells is odd.

3. The method of claim 2, wherein the step of establishing a set of symmetry constraints for each pair of devices requiring symmetry matching further includes:

determining a first distance between the symmetry line and one of the pair of devices;

determining a second distance between the symmetry line and the other of the pair of devices;

designating the greater of the first and second distances as a symmetry distance;

establishing the symmetry constraint for the one device as the difference between the location of the symmetry line and the symmetry distance; and establishing the symmetry constraint for the other device as the sum of location of the symmetry line and the symmetry distance.

4. The method of claim 1, wherein the set of size constraints for each device includes:

a constraint that expresses a distance between a left side and a right side of the device;

a constraint that expresses a distance between a top edge and a bottom edge of the device;

a constraint that expresses a distance between one side of the device and a position intermediate the left and right sides of the device; and a constraint that expresses a distance between one edge of the device and a position intermediate the top and bottom edges of the device.

5. The method of claim 1, further including, prior to step (h), establishing a set of position constraints for each device defined in a plurality of cells.

6. A method of determining the position of devices in a circuit layout comprising:

(a) defining a matrix having at least one row or one column of cells;

(b) defining a plurality of devices in the matrix, with each device received in at least one cell;

(c) establishing for each device a set of size constraints that expresses the size of the device;

(d) for a plurality of devices contained completely in a column, determining the position of one of the devices in the column and establishing a constraint for each other device in the column that expresses its position with respect to the position of the one device in the column;

(e) for a plurality of devices contained completely in a row, determining the position of one of the devices in the row and establishing a constraint for each other device in the row that expresses its position with respect to the position of the one device in the row;

(f) establishing for each pair of adjacent devices a spacing constraint that expresses a spacing therebetween;

(g) establishing a set of position constraints for each device defined in a plurality of cells, wherein the set of position constraints for the device includes:

when the device spans a plurality of columns, a constraint that expresses a location of a right side of the device with respect to the location of the right side of the rightmost cell of the plurality of cells and another constraint that expresses a location of a left side of the device with respect to the location of the left side of the leftmost cell of the plurality of cells; and when the device spans a plurality of rows, a constraint that expresses a location of a top edge of the device with respect to the location of the top edge side of the topmost cell of the plurality of cells and another constraint that expresses a location of a bottom edge of the device with respect to the location of the bottom edge side of the bottommost cell of the plurality of cells;

(h) solving the constraints established in steps (c)–(g) as a set of simultaneous equations to determine a value of a variable of each constraint; and (i) generating a layout of the devices in accordance with the values determined in step (h).

7. A computer readable medium having stored thereon instructions which, when executed by a processor, cause the processor to perform the steps of:

(a) define a matrix having at least one row or one column of cells;

(b) define a plurality of devices in the matrix, with each device received in at least one cell;

(c) establish for each device a set of size constraints that expresses the size of the device;

(d) if a plurality of devices is contained completely in a column, determine the position of one of the devices in the column and establish a constraint for each other device in the column that expresses its position with respect to the position of the one device;

(e) if a plurality of devices is contained completely in a row, determine the position of one of the devices in the row and establish a constraint for each other device in the column that expresses its position with respect to the position of the one device;

(f) establish for each pair of adjacent devices a spacing constraint that expresses a spacing therebetween;

(g) determine, for each pair of devices requiring symmetry matching, a set of symmetry constraints with respect to a symmetry line disposed therebetween;

(h) solve the constraints established in steps (c)–(g) as a set of simultaneous equations to determine a value of a variable of each constraint; and (i) generate a layout of the devices in accordance with the values determined in step (h).

8. The computer readable medium of claim 7, wherein the step of determining the set of symmetry constraints includes:

determining a number of cells that contain and are between the pair of devices;

designating a side of a cell positioned between opposing sides of the pair of devices as the symmetry line when the number of cells is even; and designating an imaginary line positioned at a center of a cell and between the pair of devices as the symmetry line when the number of cells is odd.

9. The computer readable medium of claim 8, wherein the step of determining the set of symmetry constraints for each pair of devices requiring symmetry matching further includes:

determining a first distance between the symmetry line and one of the pair of devices;

determining a second distance between the symmetry line and the other of the pair of devices;

designating the greater of the first and second distances as a symmetry distance;

establishing the symmetry constraint for the one device as the difference between the location of the symmetry line and the symmetry distance; and establishing the symmetry constraint for the other device as the sum of location of the symmetry line and the symmetry distance.

10. The computer readable medium of claim 7, wherein the set of size constraints for each device includes:

a constraint that expresses a distance between a left side and a right side of the device;

a constraint that expresses a distance between a top edge and a bottom edge of the device;

a constraint that expresses a distance between one side of the device and a position intermediate the left and right sides of the device; and a constraint that expresses a distance between one edge of the device and a position intermediate the top and bottom edges of the device.

11. The computer readable medium of claim 7, wherein the instructions cause the processor to perform the further step of:

establish a set of position constraints for each device defined in a plurality of cells.

12. The computer readable medium of claim 11, wherein the set of position constraints includes:

when the device spans a plurality of columns, a constraint that expresses a location of a right side of the device with respect to the location of the right side of the rightmost cell of the plurality of cells and another constraint that expresses a location of a left side of the device with respect to the location of the left side of the leftmost cell of the plurality of cells; and when the device spans a plurality of rows, a constraint that expresses a location of a top edge of the device with respect to the location of the top edge side of the topmost cell of the plurality of cells and another constraint that expresses a location of a bottom edge of the device with respect to the location of the bottom edge side of the bottommost cell of the plurality of cells.

13. A method of determining the position of devices in a circuit layout comprising:

(a) defining an array of cells;

(b) defining a plurality of device outlines in the array, with each device outline received in at least one cell;

(c) establishing a set of size constraints that express the size of each device;

(d) for each column and each row of cells having a plurality of device outlines contained completely therein, determining the position of one of the device outlines and establishing a constraint for each other device outline that expresses its position with respect to the position of the one device outline;

(e) establishing a spacing constraint for each pair of adjacent device outlines that expresses a spacing therebetween;

(f) establishing, for each pair of devices requiring symmetry matching, a set of symmetry constraints with respect to a symmetry line disposed therebetween;

(g) simultaneously solving the constraints established in steps (c)–(f); and (h) generating a layout of the device outlines in accordance with the solution determined in step (g).

14. The method of claim 13, further including, prior to step (f), establishing a set of position constraints for each device defined in a plurality of cells.

15. The method of claim 13, wherein the set of size constraints for each device includes:

a constraint that expresses a distance between a left side and a right side of the device;

a constraint that expresses a distance between a top edge and a bottom edge of the device;

a constraint that expresses a distance between one side of the device and a position intermediate the left and right sides of the device; and a constraint that expresses a distance between one edge of the device and a position intermediate the top and bottom edges of the device.

16. A method of determining the position of devices in a circuit layout comprising:

(a) defining an array of cells;

(b) defining a plurality of device outlines in the array, with each device outline received in at least one cell;

(c) establishing a set of size constraints that express the size of each device;

(d) for each column and each row of cells having a plurality of device outlines contained completely therein, determining the position of one of the device outlines and establishing a constraint for each other device outline that expresses its position with respect to the position of the one device outline;

(e) establishing a spacing constraint for each pair of adjacent device outlines that expresses a spacing therebetween;

(f) establishing a set of postion constraints for each device defined in a plurality of cells, wherein the set of position constraints includes:

for each device that spans a plurality of columns, a constraint that expresses a location of a right side of the device with respect to the location of the right side of the rightmost cell of the plurality of cells and another constraint that expresses a location of a left side of the device with respect to the location of the left side of the leftmost cell of the plurality of cells; and for each device that spans a plurality of rows, a constraint that expresses a location of a top edge of the device with respect to the location of the top edge side of the topmost cell of the plurality of cells and another constraint that expresses a location of a bottom edge of the device with respect to the location of the bottom edge side of the bottommost cell of the plurality of cells;

(g) simultaneously solving the constraints established in steps (c)–(f); and (h) generating a layout of the device outlines in accordance with the solution determined in step (g).

17. A method of determining the position of devices in a circuit layout comprising:

defining a matrix having at least one row or one column of cells;

defining a plurality of devices in the matrix, with each device received in at least one cell;

establishing a plurality of constraints for the devices, including, for each pair of devices requiring symmetry matching, a set of symmetry constraints with respect to a symmetry line disposed therebetween;

solving the constraints as a set of simultaneous equations to determine a value of a variable of each constraint; and generating a layout of the devices in accordance with the values determined by solving the constraints.

18. The method of claim 17, wherein establishing a set of symmetry constraints for each pair of devices requiring symmetry matching includes:

determining a number of cells that include and are between the pair of devices;

designating a side of a cell positioned between opposing sides of the pair of devices as the symmetry line when the number of cells is even; and designating an imaginary line positioned at a center of a cell between the pair of devices as the symmetry line when the number of cells is odd.

19. The method of claim 18, wherein the step of establishing a set of symmetry constraints for each pair of devices requiring symmetry matching further includes:

determining a first distance between the symmetry line and one of the pair of devices;

determining a second distance between the symmetry line and the other of the pair of devices;

designating the greater of the first and second distances as a symmetry distance;

establishing the symmetry constraint for the one device as the difference between the location of the symmetry line and the symmetry distance; and establishing the symmetry constraint for the other device as the sum of location of the symmetry line and the symmetry distance.

20. A computer readable medium having stored thereon instructions which, when executed by a processor, cause the processor to perform the steps of:

defining a matrix having at least one row or one column of cells;

defining a plurality of devices in the matrix, with each device received in at least one cell;

determining a plurality of constraints for the devices, including, for each pair of devices requiring symmetry matching, a set of symmetry constraints with respect to a symmetry line disposed therebetween;

solving the constraints as a set of simultaneous equations to determine a value of a variable of each constraint; and generating a layout of the devices in accordance with the values determined by solving the constraints.

21. The computer readable medium of claim 20, wherein the step of determining the set of symmetry constraints includes:

determining a number of cells that contain and are between the pair of devices;

designating a side of a cell positioned between opposing sides of the pair of devices as the symmetry line when the number of cells is even; and designating an imaginary line positioned at a center of a cell and between the pair of devices as the symmetry line when the number of cells is odd.

22. The computer readable medium of claim 21, wherein the step of determining the set of symmetry constraints for each pair of devices requiring symmetry matching further includes:

determining a first distance between the symmetry line and one of the pair of devices;

determining a second distance between the symmetry line and the other of the pair of devices;

designating the greater of the first and second distances as a symmetry distance;

establishing the symmetry constraint for the one device as the difference between the location of the symmetry line and the symmetry distance; and establishing the symmetry constraint for the other device as the sum of location of the symmetry line and the symmetry distance.

* * * * *

UNITED STATES PATENT AND TRADEMARK OFFICE
CERTIFICATE OF CORRECTION

PATENT NO. : 6,918,102 B2
DATED : July 12, 2005
INVENTOR(S) : Rob A. Rutenbar et al.

It is certified that error appears in the above-identified patent and that said Letters Patent is hereby corrected as shown below:

Title page,
Item [75], Inventor, please replace "Elias L. Fallon, Tempe, PA (US)" with -- Elias L. Fallon, Tempe, AZ (US) --.

Column 16,
Line 33, please replace "set of postion constraimts" with -- set of position constraints --.

Signed and Sealed this

Twenty-ninth Day of November, 2005

JON W. DUDAS
*Director of the United States Patent and Trademark Office*